(12) United States Patent
Hsu

(10) Patent No.: US 12,444,350 B2
(45) Date of Patent: Oct. 14, 2025

(54) ORGANIC DISPLAY DEVICE

(71) Applicant: SENSORTEK TECHNOLOGY CORP., Zhubei (TW)

(72) Inventor: Han-Chung Hsu, Zhubei (TW)

(73) Assignee: Sensortek Technology Corp., Zhubei (TW)

( * ) Notice: Subject to any disclaimer, the term of this patent is extended or adjusted under 35 U.S.C. 154(b) by 0 days.

(21) Appl. No.: 17/837,432

(22) Filed: Jun. 10, 2022

(65) Prior Publication Data

US 2022/0398975 A1    Dec. 15, 2022

Related U.S. Application Data

(60) Provisional application No. 63/209,134, filed on Jun. 10, 2021.

(51) Int. Cl.
*G09G 3/3208* (2016.01)
*H10K 59/13* (2023.01)

(52) U.S. Cl.
CPC ............ *G09G 3/3208* (2013.01); *H10K 59/13* (2023.02); *G09G 2320/0693* (2013.01); *G09G 2360/144* (2013.01); *G09G 2360/145* (2013.01)

(58) Field of Classification Search
CPC ......... G09G 3/3208; G09G 2320/0693; G09G 2360/144; G09G 2360/145; H10K 59/13
See application file for complete search history.

(56) References Cited

U.S. PATENT DOCUMENTS

2008/0262146 A1\* 10/2008 Yonezawa ................ G02B 1/14
                                                                        524/560
2010/0109187 A1\*  5/2010 Smith ........................ C08J 5/18
                                                                        264/216
(Continued)

FOREIGN PATENT DOCUMENTS

CN    111969026 A    11/2020
CN    112729538 A     4/2021
(Continued)

OTHER PUBLICATIONS

International Official Action Issued by Foreign Patent Office in Application No. 111121759 (First Document).
(Continued)

*Primary Examiner* — Chanh D Nguyen
*Assistant Examiner* — Gloryvid Figueroa-Gibson
(74) *Attorney, Agent, or Firm* — Rosenberg, Klein & Lee

(57) ABSTRACT

The present application provides an organic display device, which comprising a light sensing device and an organic light emitting diode display panel, based on the organic light emitting diode display panel disposed on the light sensing device, and first and second light sensing regions disposed on the light sensing device, and first and second filtering devices further disposed on the first and second light sensing regions, the light sensing device senses an ambient signal passing through the organic light emitting diode display panel, the first and second filtering devices, and a display signal generated from the organic light emitting diode display panel and passing through the first and second filtering devices. Thereby, the ambient light signal and display light signal are sensed by a light sensing manner under the display panel (under display sensing).

9 Claims, 3 Drawing Sheets

(56) References Cited

U.S. PATENT DOCUMENTS

| | | | | |
|---|---|---|---|---|
| 2019/0315105 A1* | 10/2019 | Isojima | ................ | H10K 50/00 |
| 2022/0120609 A1* | 4/2022 | Hsu | ...................... | G01J 1/0429 |
| 2023/0228621 A1* | 7/2023 | Sampsell | ............. | G09G 3/3208 |
| | | | | 345/207 |
| 2023/0324218 A1* | 10/2023 | Hegde | .................. | G01J 1/4228 |
| | | | | 250/226 |

FOREIGN PATENT DOCUMENTS

| | | |
|---|---|---|
| CN | 112908273 A | 6/2021 |
| TW | I232319 B | 5/2005 |
| TW | 201128629 A | 8/2011 |

OTHER PUBLICATIONS

International Official Action Issued by Foreign Patent Office in Application No. 111121759 (Second Document).

* cited by examiner

ORGANIC DISPLAY DEVICE

FIELD OF THE INVENTION

The present application relates generally to a display device, and particularly to an organic display device that senses ambient light signal and display light signal by a light sensing device under the display panel.

BACKGROUND OF THE INVENTION

Modern display devices generally include a light sensor for detecting ambient light signals and adjusting the display devices to the corresponding brightness according to the light intensity of the sensed ambient light signal. Nonetheless, it is difficult for a light sensor to differentiate the ambient light signal from the display light signal from the display device and hence retarding provision accurate sensing result of ambient light. That is to say, for ambient light signals, display light signals are regraded as noises by the system.

To solve the above noise problem, some developers further proposed a two-light-sensor solution for sensing ambient light signal and display light signal, respectively, and including a light filtering device on one of the light sensors. Unfortunately, this method results in increased costs of a display device.

Accordingly, the present application provides an organic display device, which comprises one light sensing device disposed below an organic display panel and two light sensing regions with two light filtering devices, respectively, for generating different light sensing signals. Since different light sensing signals can be generated, the increased costs of display devices can be avoided.

SUMMARY

An objective of the present application is to provide an organic display device. A light sensing device includes a first light sensing region and a second light sensing region for sensing for sensing the ambient light signal and the display light signal of the organic light-emitting diode (OLED) display panel and generating different light sensing signals.

Another objective of the present application is to provide an organic display device. Using different light sensing signals, an ambient light signal and an ambient light sensing value are given. According to the ambient light sensing value, an error will be given. Furthermore, according to the error, adjust the light intensity of a display light signal of the OLED display panel.

To achieve the above objectives, the present application provides an organic display device, which comprises a light sensing device and an OLED display panel. The light sensing device includes a first sensing region and a second light sensing region. The light sensing device further includes a first light filtering device disposed on the first light sensing region; The light sensing device further includes a second light filtering device disposed on the second light sensing region. The OLED display panel is disposed on the light sensing device. In addition to sensing an ambient light signal passing through the OLED display panel, the first light filtering device, and the second light filtering device, the first light sensing region and the second light sensing region further sense a display light signal generated by the OLED display panel and passing through the first light filtering device and the second light filtering device. Then the first sensing region generates a first light sensing signal according to the ambient light signal and the display light signal passing through the first light filtering device; the second sensing region generates a second light sensing signal according to the ambient light signal and the display light signal passing through the second light filtering device. Thereby, according to the present application, different light sensing regions generate different light sensing signals.

According to an embodiment of the present application, a first circular polarization direction of the first light filtering device is identical to a panel circular polarization direction of the OLED display panel; a second circular polarization direction of the second light filtering device is different from the panel circular polarization direction. Thereby, the output light of the first light filtering device is different from the output light of the second light filtering device.

According to another embodiment of the present application, the organic display device further comprises an operational circuit, which receives the first light sensing signal and the second light sensing signal corresponding to a light sensing matrix. The operational circuit acquires an ambient light sensing value according to the light sensing matrix, the first light sensing signal, and the second light sensing signal. The operational circuit acquires an error according to the ambient light sensing value and an ambient light intensity. Thereby, the organic display device can adjust the light intensity of the display light signal according to the error.

DETAILED DESCRIPTION

In order to make the structure and characteristics as well as the effectiveness of the present application to be further understood and recognized, the detailed description of the present application is provided as follows along with embodiments and accompanying figures.

To solve the problem of light sensing noise, the display device according to the prior art faces the challenge of increased costs. The present application solves the above problem by using a light sensing device and different light sensing regions corresponding to different light filtering devices.

In the following description, various embodiments of the present application are described using figures for describing the present application in detail. Nonetheless, the concepts of the present application can be embodied by various forms. Those embodiments are not used to limit the scope and range of the present application.

Figure 1:
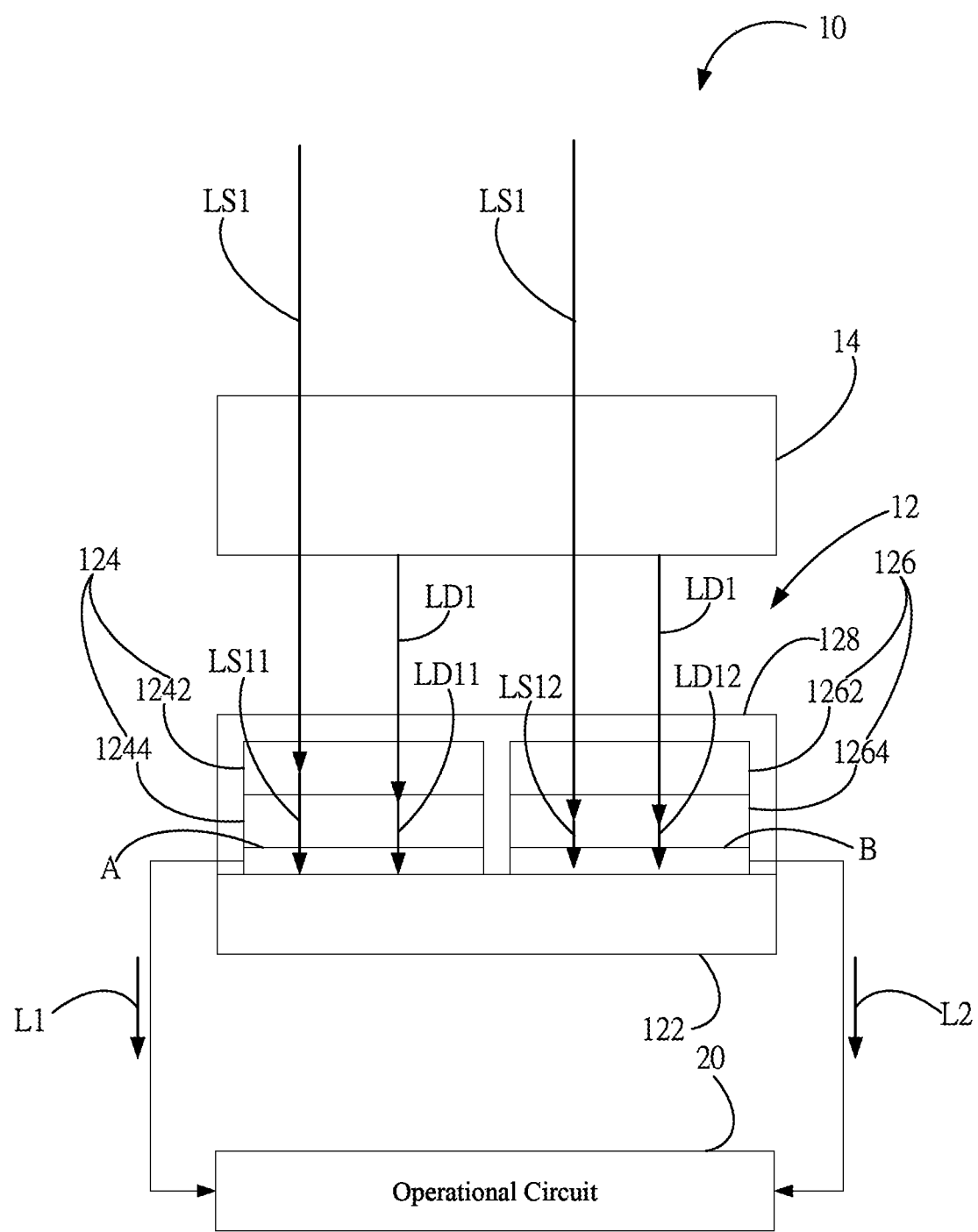
FIG. 1 shows a schematic diagram of the structure according a first embodiment of the present application.

First, please refer to FIG. 1, which shows a schematic diagram of the structure according a first embodiment of the present application. As shown in the figure, an organic display device 10 according to the present embodiment comprises a light sensing device 12 and an OLED display panel 14. The light sensing device 12 includes a light sensing chip 122, a first light filtering device 124, and a second light filtering device 126. The light sensing chip 122 includes a first light sensing region A and a second light sensing region B. The first light filtering device 124 includes a first wave plate 1242 and a first polarization sheet 1244. The second light filtering device 126 includes a second wave plate 1262 and a second polarization sheet 1264.

The first light filtering device 124 and the second light filtering device 126 are both circular polarization sheet structures disposed on the first light sensing region A and the second light sensing region B. Thereby, the light passing through the first light filtering device 124 and the second light filtering device 126 corresponds to the circular polarization angles of the first light filtering device 124 and the second light filtering device 126, respectively. In particular, the first light filtering device 124 and the second light filtering device 126 have different circular polarization angles. Thereby, the circular polarization angle of the light passing through the first light filtering device 124 and the circular polarization angle of the light passing through the second light filtering device 126.

The first wave plate 1242 and the second wave plate 1262 are phase delay sheets with the material selected from birefringent polymers. The material of the first polarization sheet 1244 and the second polarization sheet 1264 is selected from polyvinyl alcohol.

In particular, according to the present embodiment, the circular polarization angle of the first light filtering device 124 is equivalent to the circular polarization angle of the OLED display panel 14. The circular polarization angle of the second light filtering device 126 is different from the circular polarization angle of the OLED display panel 14. Thereby, the light intensity of a first display filtered light LD11 acquired by passing the display light signal LD1 generated by the OLED display panel 14 through the first light filtering device 124 is greater than the light intensity of a second display filtered light LD2 acquired by passing the display light signal LD1 generated by the OLED display panel 14 through the second light filtering device 126.

Likewise, since the circular polarization angle of the first light filtering device 124 is equivalent to the circular polarization angle of the OLED display panel 14, the light intensity of a first ambient filtered light LS11 acquired by passing the ambient light signal LS1 through the first light filtering device 124 is greater than the light intensity of a second ambient filtered light LS12 acquired by passing the ambient light signal LS1 through the second light filtering device 126.

The first light sensing region A generates a corresponding first light sensing signal L1 according to the first ambient filtered light LS11 corresponding to the ambient light signal LS1, and the first display filtered light LD11 corresponding to the display light signal LD1. The second light sensing region B generates a corresponding second light sensing signal L2 the second ambient filtered light LS12 corresponding to the ambient light signal LS1, and the second display filtered light LD12 corresponding to the display light signal LD1.

Furthermore, the light sensing device 12 according to the present embodiment further comprises a gel member 128 disposed between the light sensing chip 122 and the OLED display panel 14 and packaging the first light filtering device 124 and the second light filtering device 126 on the light sensing chip 122.

Figure 2:
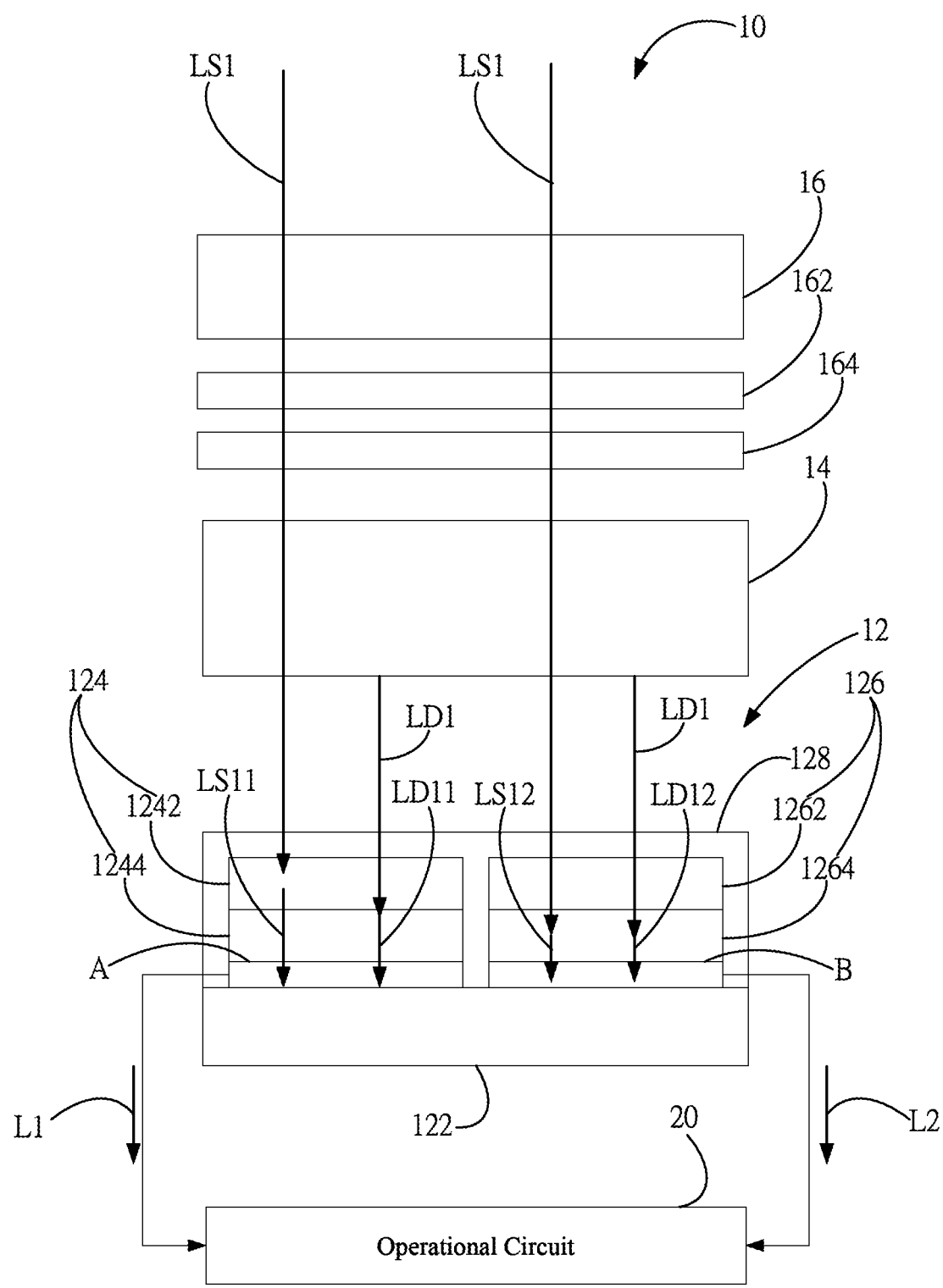
FIG. 2 shows a schematic diagram of the structure according a second embodiment of the present application.

The description above illustrates applying the light sensing device 10 according to the present application to the OLED display panel 14. In addition, it can be applied to a touch panel. That is to say, as shown in FIG. 2, in addition to the OLED display panel 14, the organic display device 10 can further comprise a touch panel 16.

As shown in the figure, the present application can further comprise a touch panel 16 disposed on the OLED display panel 14. The present application can further comprise a linear polarization sheet 162 and a ¼-wavelength sheet 164 both disposed between the OLED display panel 14 and the touch panel 16.

According to the present embodiment, which is different from the first embodiment of the present application, the ambient light signal LS1 further passes through the touch panel 16, the linear polarization sheet 162, and the ¼-wavelength sheet and then through the OLED display panel 14, the first light filtering device 124, and the second light filtering device 126. The ambient light signal LS1 passes through the touch panel 16, the linear polarization sheet 162, and the ¼-wavelength sheet for further attenuating the light intensity. The details will not be described further.

In addition, according to the embodiment described above, the organic display device 10 further comprises an operational circuit 20, which is coupled to the light sensing device 12, particularly to the light sensing chip 122. The light sensing chip 122 generates and transmits the first light sensing signal L1 corresponding to the first light sensing region A to the operational circuit 20 the first ambient filtered light LS11 corresponding to the ambient light signal LS1, and the first display filtered light LD11 corresponding to the display light signal LD1. The light sensing chip 122 generates and transmits the second light sensing signal L2 corresponding to the second light sensing region B to the operational circuit 20 according to the second ambient filtered light LS12 corresponding to the ambient light signal LS1, and the second display filtered light LD12 corresponding to the display light signal LD1. Thereby, the first light sensing signal L1 and the second light sensing signal L2 acquired by the operational circuit 20 can be expressed as equations (1) and (2) below:

$$L1 = LS11 + LD11 = a1*S + b1*O \quad (1)$$

$$L2 = LS12 + LD12 = a2*S + b2*O \quad (2)$$

where S is the light intensity of the ambient light signal LS1 sensed by the light sensing device 12; O is the light intensity of the display light signal LD1 sensed by the light sensing device 12; a1, a2, b1, and b2 are the first ambient light sensing coefficient, the second ambient light sensing coefficient, the first display light sensing coefficient, and the second display light sensing coefficient, respectively. The first ambient light sensing coefficient a1, the second ambient light sensing coefficient a2, the first display light sensing coefficient b1, and the second display light sensing coefficient b2 are not equal to zero. The first ambient light sensing coefficient a1 is greater than the second ambient light sensing coefficient a2. The first display light sensing coefficient b1 is greater than the second display light sensing coefficient b2.

Figure 3:
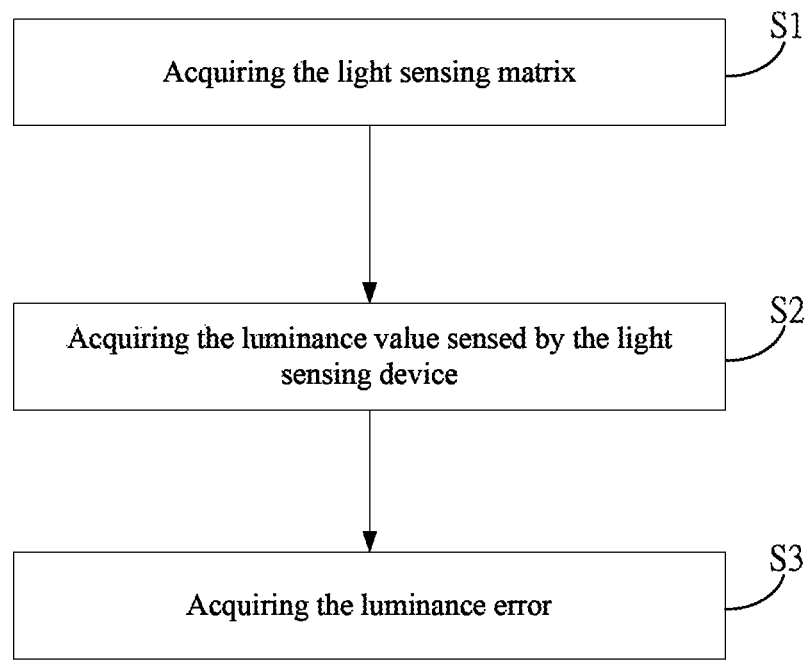
FIG. 3 shows a flowchart for acquiring the luminance error according to the present application.

FIG. 3 shows a flowchart for acquiring the luminance error according to the present application. As shown in the figure, to acquire the luminance error, the corresponding steps include:

Step S1: Acquiring the light sensing matrix;

Step S2: Acquiring the luminance value sensed by the light sensing device; and

Step S3: Acquiring the luminance error.

TABLE 1

| Scene | Ambient-Light Sensing Value (LUX) | | | Ambient-Light Real Value (LUX) | | | Sensing Result of Light Sensing Device | | Luminance Error | Element of Light Sensing Matrix | |
|---|---|---|---|---|---|---|---|---|---|---|---|
| | X' | Y' | Z' | X | Y | Z | L1 | L2 | Lux % | a21i | a22i |
| 1 | 102 | 99 | 45 | 99 | 102 | 58 | 5452 | 2814 | −3.30% | 3.94811E−02 | −4.02833E−02 |
| 2 | 111 | 108 | 49 | 110 | 107 | 49 | 5860 | 2992 | 0.39% | 3.86751E−02 | −3.97595E−02 |
| 3 | 114 | 111 | 51 | 117 | 108 | 39 | 6050 | 3102 | 2.43% | 1.81751E−02 | −1.91636E−02 |
| 4 | 112 | 101 | 34 | 112 | 101 | 34 | 31650 | 28237 | 0.01% | | |

In the step S1, as shown in Table 1 above, the first light sensing signal L1 and the second light sensing signal L2 sensed by the light sensing device 12 correspond to a light sensing matrix, as well as to the ambient light signal LS1. The correspondence is shown in the following equation (3):

$$\begin{bmatrix} X \\ Y \\ Z \end{bmatrix} = \begin{bmatrix} a11i & a12i \\ a21i & a22i \\ a31i & a32i \end{bmatrix} \begin{bmatrix} L1 \\ L2 \end{bmatrix} \quad (3)$$

where the ambient-light real values X, Y, Z correspond to the three-color stimulation values of the ambient light signal LS1. In the step S1, the first light sensing signal L1, the second light sensing signal L2, and the ambient-light real values X, Y, Z can be used to deduce the elements a11i, a12i, a21i, a22i, a31i, a32i in the light sensing matrix as shown in equation (3).

In the step S2, according to the matrix elements a21, a22 of the light sensing matrix, the first light sensing signal L1', and the second light sensing signal L2' of the other scenes, an ambient-light sensing value is further calculated according to equation (4):

$$Y' = a21i*L1' + a22i*L2' \quad (4)$$

where Y' is the ambient-light sensing value calculated by the operational circuit 20 according to the sensing result of the light sensing device 12 on the ambient light signal LS1. Namely, Y' is the corresponding light intensity of the ambient light signal LS1 sensed by the light sensing device 12.

In the step S3, the operational circuit 20 acquires an error according to an ambient-light intensity value (namely, the ambient-light real value Y) and the ambient-light sensing value Y', as shown in equation (5) below:

$$ERR(\%) = 100\% * (Y' - Y)/Y \quad (5)$$

where ERR is the error, namely, the luminance error; Y is the default ambient-light intensity value of the scene; Y' is the ambient-light sensing value corresponding to the first light sensing signal L1 and the second light sensing signal L2. As shown in Table 1 above, according to different application scenes, the matrix elements a21, a22 of the light sensing matrix will be different correspondingly. The variation of the real values X Y, Z varies the matrix elements of the light sensing matrix. Thereby, the corresponding sensing values X', Y', Z' of the first light sensing signal L1 and the second light sensing signal L2 generated by the light sensing device 12 will vary according to the light sensing matrix. Accordingly, the organic display device 10 according to the present application can sense the ambient light signal LS1 using the light sensing device according to different scenes and deduce the corresponding luminance error. Hence, the OLED display panel 14 can adjust the light intensity of the display light signal LD1 according to the luminance error. For example, the light sensing device 12 according to the present application can further sense the ambient light signal LS1 below 50 lux so that the OLED display panel 14 can adjust the light intensity of the display light signal LD1 below 50 lux and thus preventing inability of changing the light intensity of the display light signal LD1 in a low luminance ambience.

According to the above embodiment, X, Y, Z are defined in the CIE1931 color space for example. Nonetheless, the present application is not limited to the embodiment. They can be applied to the RGB, Lab, or HSL color space. A person having ordinary skill in the art knows how to convert X, Y, Z in the CIE1931 color space to another color space. Hence, the details will be described again.

According to the above embodiment, one or more light channel (not shown in the figures) is disposed at the bottom of the OLED display panel 14 corresponding to the first light sensing region A and the second light sensing region B, respectively. When the first light sensing region A and the second light sensing region B correspond to a plurality of light channels, respectively, the first light sensing region A and the second light sensing region B have a single or different frequency response, respectively.

According to the above embodiment, the organic display device according to the present application uses the light sensing device to sense the first light sensing region and the second light sensing region to give the first light sensing signal and the second light sensing signal. The operational circuit acquires the corresponding luminance result according to the light sensing matrix, the first light sensing signal, and the second light sensing signal and further fives the luminance error. Then the OLED display panel of the organic display device can adjust the light intensity of the display light signal according to the luminance error.

The invention claimed is:

1. An organic display device, comprising:
 a light sensing device, including a first light sensing region and a second light sensing region, further including a first light filtering device disposed on said first light sensing region and further including a second light filtering device disposed on said second light sensing region, said first light filtering device and said second light filtering device have first and second circular polarization angles while said first light filtering device includes a first wave plate and a first polarization sheet, said second light filtering device includes a second wave plate and a second polarization sheet, and said first wave plate and said second wave plate are phase delay sheets;
 an organic light-emitting diode display panel, disposed on said light sensing device, generating a display light signal; and
 an operational circuit, coupled to said light sensing device, receiving a first light sensing signal and a second light sensing signal from said light sensing device, said first light sensing signal and said second light sensing signal corresponding to a light sensing matrix, said operational circuit acquiring an ambient light sensing value corresponding to an ambient light intensity of an ambient light signal according to said light sensing matrix, said first light sensing signal and said second light sensing signal, wherein said first light sensing region and said second light sensing region sense a first ambient filtered light and a second ambient filtered light while said ambient light signal is passing through said organic light-emitting diode display panel, said first light filtering device, and said second light filtering device, based on said first circular polarization angle and said second circular polarization angle;

wherein said first light sensing region and said second light sensing region sense a first display filtered light and a second display filtered light while said display light signal is passing through said first light filtering device and said second light filtering device, based on said first circular polarization angle and said second circular polarization angle;

wherein said first light sensing region generates said first light sensing signal according to said first ambient filtered light and said first display filtered light, and said first light sensing signal is indicative of said first ambient filtered light and said first display filtered light received sensed by said first sensing region;

wherein said second sensing region generates said second light sensing signal according to said second ambient filtered light and said second display filtered light, and said second light sensing signal is indicative of said second ambient filtered light and said second display filtered light sensed by said second sensing region; and wherein said ambient light sensing value and said ambient light intensity of said ambient light signal correspond to a light intensity of said display light signal adjusted by said organic light-emitting diode display panel.

2. The organic display device of claim 1, wherein a first ambient light sensing coefficient of said first light sensing signal is greater than a second ambient light sensing coefficient of said second light sensing signal.

3. The organic display device of claim 2, wherein said first ambient light sensing coefficient and said second ambient light sensing coefficient are not equal to zero.

4. The organic display device of claim 1, wherein a first ambient light sensing coefficient of said first light sensing signal is different from a second ambient light sensing coefficient of said second light sensing signal.

5. The organic display device of claim 4, wherein said first ambient light sensing coefficient and said second ambient light sensing coefficient are not equal to zero.

6. The organic display device of claim 1, wherein the material of said first polarization sheet and said second polarization sheet is selected from polyvinyl alcohol; and the material of said first wave plate and said second wave plate is selected from birefringent polymers.

7. The organic display device of claim 1, wherein a first circular polarization direction of said first light filtering device is identical to a panel circular polarization direction of said organic light-emitting diode display panel; a second circular polarization direction of said second light filtering device is different from said panel circular polarization direction.

8. The organic display device of claim 1, wherein said operational circuit acquires an error according to said ambient light sensing value and said ambient light intensity of said ambient light signal, and said organic light-emitting diode display panel adjusting said light intensity of said display light signal according to said error.

9. The organic display device of claim 1, further comprising a gel member, disposed between said organic light-emitting diode display panel and said light sensing device, and packaging said first light filtering device and said second light filtering device.

* * * * *